(12) United States Patent
Takaoka et al.

(10) Patent No.: US 8,354,731 B2
(45) Date of Patent: Jan. 15, 2013

(54) SEMICONDUCTOR DEVICE

(75) Inventors: Hiromichi Takaoka, Kanagawa (JP);
Yoshitaka Kubota, Kanagawa (JP);
Hiroshi Tsuda, Kanagawa (JP)

(73) Assignee: Renesas Electronics Corporation,
Kawasaki-shi, Kanagawa (JP)

( * ) Notice: Subject to any disclaimer, the term of this patent is extended or adjusted under 35 U.S.C. 154(b) by 692 days.

(21) Appl. No.: 12/461,160

(22) Filed: Aug. 3, 2009

(65) Prior Publication Data

US 2010/0032798 A1 Feb. 11, 2010

(30) Foreign Application Priority Data

Aug. 11, 2008 (JP) ................. 2008-207356

(51) Int. Cl.
*H01L 29/00* (2006.01)
(52) U.S. Cl. ............... 257/529; 257/209; 257/E23.146; 257/E23.149; 257/E23.15
(58) Field of Classification Search ............ 257/209, 257/529, E23.146, E23.149, E23.15
See application file for complete search history.

(56) References Cited

U.S. PATENT DOCUMENTS

| | | | |
|---|---|---|---|
| 2007/0262414 A1 | 11/2007 | Ueda | |
| 2008/0211059 A1* | 9/2008 | Kwon et al. | 257/529 |
| 2010/0037454 A1 | 2/2010 | Ueda | |
| 2010/0320562 A1* | 12/2010 | Kono et al. | 257/529 |

FOREIGN PATENT DOCUMENTS

| | | |
|---|---|---|
| CN | 101071802 (A) | 11/2007 |
| JP | 2005-039220 | 2/2005 |
| JP | 2005-057186 | 3/2005 |
| JP | 2006-253237 | 9/2006 |
| JP | 2007-305693 | 11/2007 |
| KR | 10-2008-0067921 (A) | 7/2008 |

OTHER PUBLICATIONS

Chinese Office Action dated Jul. 30, 2010, with English translation.

* cited by examiner

*Primary Examiner* — Matthew E Warren
(74) *Attorney, Agent, or Firm* — McGinn IP Law Group, PLLC

(57) ABSTRACT

The semiconductor device includes: a substrate; an electric fuse that includes a lower-layer wiring formed on the substrate, a first via provided on the lower-layer wiring and connected to the lower-layer wiring, and an upper-layer wiring provided on the first via and connected to the first via, a flowing-out portion of a conductive material constituting the electric fuse being formed in a cut-off state of the electric fuse; and a heat diffusion portion that includes a heat diffusion wiring that is formed in the same layer as one of the upper-layer wiring and the lower-layer wiring and is placed on a side of the one of the upper-layer wiring and the lower-layer wiring, the heat diffusion portion being electrically connected to the one of the upper-layer wiring and the lower-layer wiring.

19 Claims, 14 Drawing Sheets

SEMICONDUCTOR DEVICE

This application is based on Japanese patent application No. 2008-207356, the content of which is incorporated herein by reference.

BACKGROUND

1. Technical Field

The present invention relates to a semiconductor device, and more particularly, to a semiconductor device including an electric fuse.

2. Related Art

There has been a technique by which a fuse is provided in a semiconductor device, and the value of the resistance used in the semiconductor device is adjusted, or a defective element is detached and is replaced with an appropriate element by cutting off the fuse.

To cut off a fuse, a laser beam is emitted onto part of the fuse, or current is applied to the fuse.

Japanese Patent Application Laid-Open (JP-A) Nos. 2005-39220, 2005-57186, and 2006-253237 disclose electric fuses that are cut off when the material forming each fuse moves due to electromigration.

JP-A No. 2005-39220 discloses a fuse that can be cut off by a small amount of current. In JP-A No. 2005-39220, the conductive material forming the fuse is bent several times. JP-A No. 2005-57186 discloses a structure in which the lower portion and the upper portion of the fusing area are covered with a plate, and a side of the fusing area is covered with a via.

JP-A No. 2006-253237 discloses a fuse device that includes a first wiring, a second wiring formed above the first wiring via an insulating film, and a first via that is formed in the insulating film so as to connect the first wiring and the second wiring. The first via is mainly made of a material that is more likely to cause electromigration than the main components of the first wiring and the second wiring. JP-A No. 2006-253237 also discloses a structure in which a heater wiring that heats the via is placed in the vicinity of the via. With this arrangement, the temperature in the area surrounding the via is increased at the time of via cut-off, so that the via can be efficiently cut off.

The present inventors have recognized as follows. In a case where a fuse is cut off when the material forming the fuse moves due to electromigration as disclosed in JP-A Nos. 2005-39220, 2005-57186, and 2006-253237, the material moves to cause a reconnection at the cut-off portion, if a heat treatment is performed on the semiconductor device after the fuse cut-off, or if the semiconductor device is exposed to the heat that is generated in practical use. If such a reconnection is caused, a correct result cannot be obtained when a check is made to determine whether the electric fuse that has been cut off is in a cut-off state. The probability of such a reconnection is not very high, and it is considered that no problems are caused in regular operations. However, in a case where the semiconductor device is expected to have very high reliability or is used under severe conditions, it is necessary to improve the retention properties so as to maintain the electric fuse in a desirable cut-off state.

To solve the above problem, JP-A No. 2007-305693 discloses a novel method for cutting off an electric fuse so-called a crack assist type process. According to this process, the structure of the electric fuse and the voltage application to the electric fuse are controlled so as to forcibly cause the conductive material of the electric fuse to flow out at a part of the electric fuse and to flow into the insulating film existing in the vicinity of the conductive material. By doing so, the balance between the material flowing-out and supply is upset, and a large cut-off portion is formed in another area. In this manner, the probability of a reconnection of a cut-off electric fuse can be made much lower, and a desirable cut-off state can be maintained.

In an electric fuse that is cut off in the above manner, however, the flowing-out of the conductive material becomes large. Therefore, it is necessary to control the location of the flowing-out of the conductive material and the movement of the flowing-out portion of the conductive material.

SUMMARY

In one embodiment, there is provided a semiconductor device including: a substrate; an electric fuse that includes a lower-layer wiring formed on the substrate, a first via provided on the lower-layer wiring and connected to the lower-layer wiring, and an upper-layer wiring provided on the first via and connected to the first via, a flowing-out portion of a conductive material constituting the electric fuse being formed in a cut-off state of the electric fuse; and a heat diffusion portion that includes a heat diffusion wiring that is formed in the same layer as one of the upper-layer wiring and the lower-layer wiring and is placed on a side of the one of the upper-layer wiring and the lower-layer wiring, the heat diffusion portion being electrically connected to the one of the upper-layer wiring and the lower-layer wiring.

The electric fuse of the present invention can be cut off through the following procedures.

A predetermined voltage is applied to both ends (the lower-layer wiring side and the upper-layer wiring side) of the electric fuse, so as to cause a current to flow in the electric fuse. The conductive material constituting the electric fuse expands due to self-heating caused by the current in the conductive film. The conductive material expands at a higher rate than the insulating film in the vicinity of the conductive material. As a result, a crack is formed in the insulating film, and the conductive material flows out from the upper-layer wiring, so as to fill the crack. Further, the conductive material inside the via moves toward the flowing-out portions. As a result, a void is formed in the via, and the electric fuse is cut-off.

It has become apparent from the studies made by the inventors of the present invention that a flowing-out portion is more frequency formed at the lower portions of the upper-layer wiring, if an excessive temperature rise is caused in the conductive material constituting the electric fuse. It has also become apparent that a flowing-out portion at the lower portions might electrically connect to the lower-layer wiring, to cause short-circuiting. Therefore, it is desirable to avoid excessive temperature rise in the conductive material constituting the electric fuse when cutting the electric fuse. As described above, a heat diffusion wiring is provided in the vicinity of the electric fuse and is electrically connected to the electric fuse, so that the heat generated in the electric fuse can be released to the heat diffusion wiring, and an excessive temperature rise in the electric fuse can be prevented. With this arrangement, excessive heating of the upper-layer wiring can be prevented at the time of cut-off, and an unintended flowing-out of the conductive material can be prevented. As a result, short-circuiting of the electric fuse after the cut-off can also be prevented.

According to the present invention, an electric fuse can be maintained in a desirable cut-off state.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
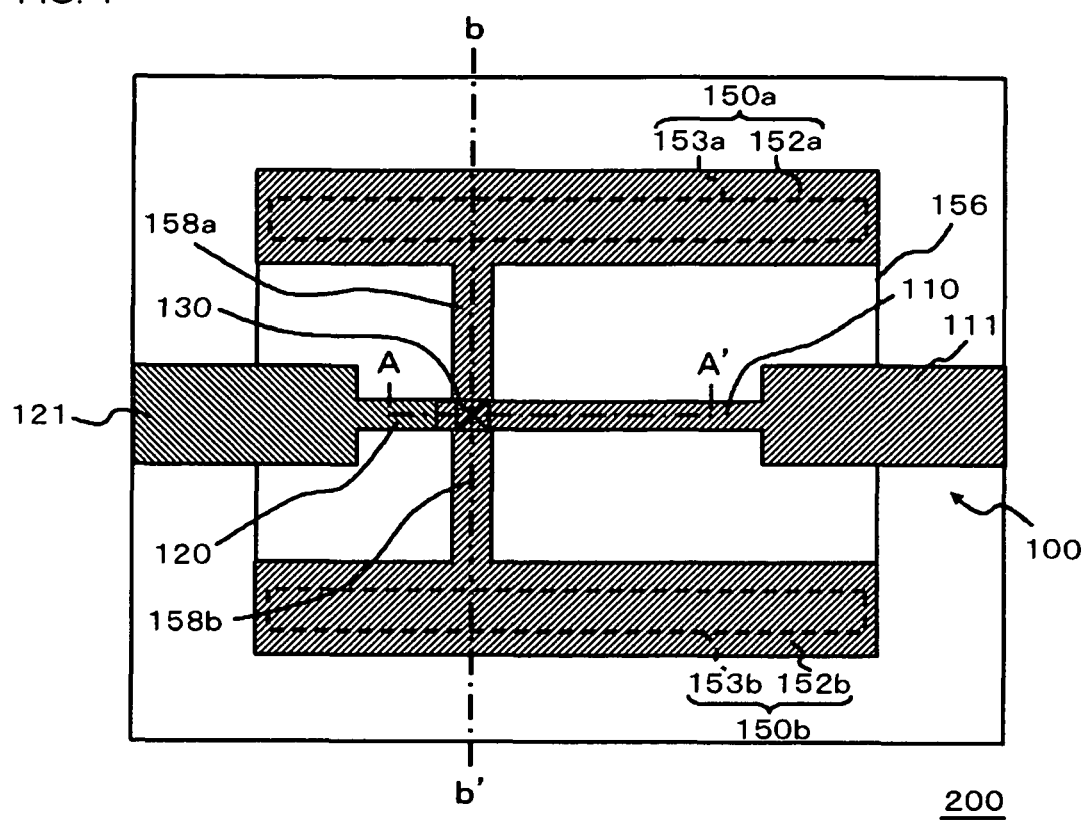
FIG. 1 is a schematic plan view showing an example structure of a semiconductor device including an electric fuse in accordance with an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the following description, like components are denoted by like reference numerals, and explanation of them will not be repeated.

In the embodiments of the present invention, an electric fuse is cut off by a crack assist type process. The procedures to cut off an electric fuse in the crack assist type process are as follows:

1) An appropriate amount of power is applied to the electric fuse by injecting an excessive amount of electrons through the upper-layer wiring, for example, thereby heating the wiring and the via.

2) The conductive material constituting the heated wiring and via expands to form a crack in the surrounding insulating film and barrier metal film. At this point, a crack is formed around the wiring having the larger area in the in-plane direction of the semiconductor substrate (or the wiring having the larger volume).

3) The conductive material flows into the crack in the insulating film and the barrier metal film to reduce a density of the conductive material constituting the electric fuse.

4) As a result, the conductive material of the via portion having the smaller area in the in-plane direction of the semiconductor substrate (or the via portion having the smaller volume) is absorbed in the flowing-out direction, so as to compensate for the decrease in density. Thus, a cut-off point is formed in the via portion, and the electric fuse is cut off.

Figure 15A:
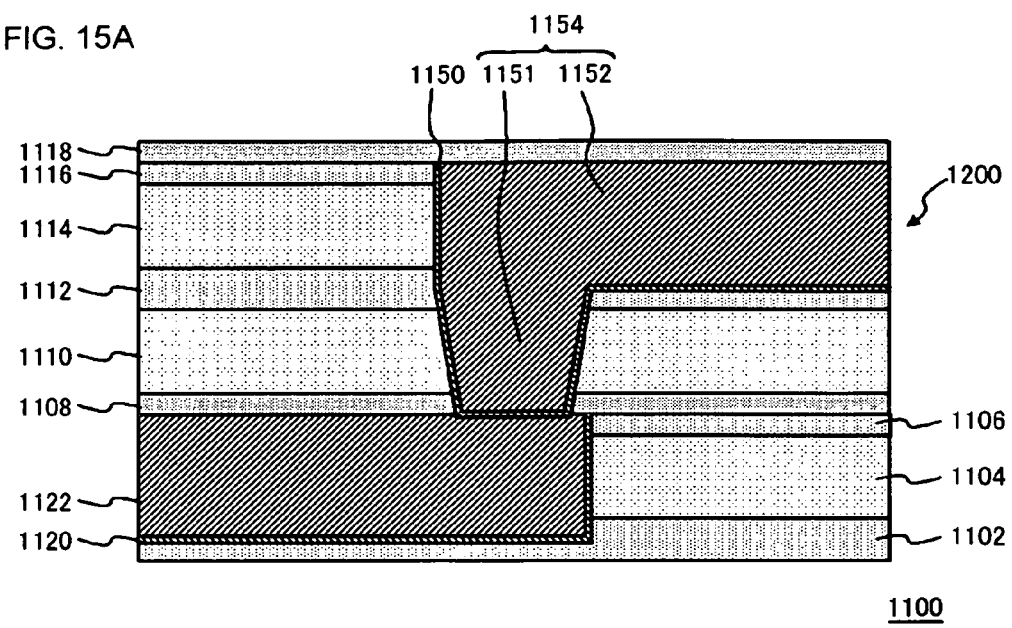
FIGS. 15A and 15B are cross-sectional views for explaining the operation in which an electric fuse is cut off by a crack assist type process.
Figure 15B:
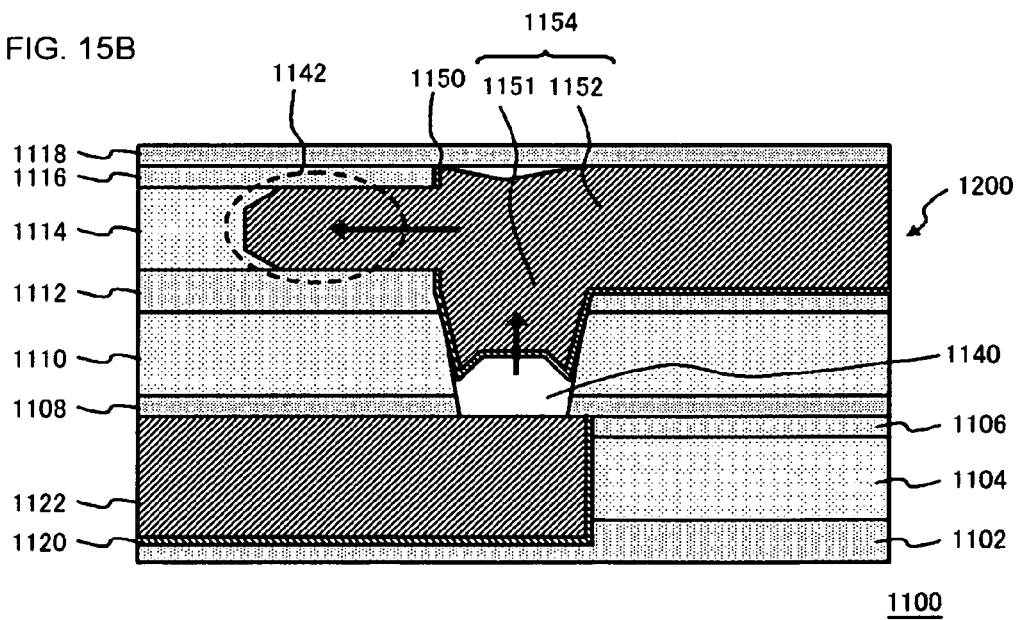

Referring now to FIGS. 15A and 15B, the operation in which an electric fuse is cut off by the crack assist type process is described. FIGS. 15A and 15B are cross-sectional views showing the structure of a semiconductor device 1100 including an electric fuse 1200. FIGS. 15A and 15B illustrate a state before the electric fuse 1200 is cut off, and a state after the electric fuse 1200 is cut off, respectively. In this example, the wiring structure has a dual damascene structure.

The semiconductor device 1100 includes a semiconductor substrate (not shown) and the following films formed sequentially on the semiconductor substrate: an etching stopper film 1102, an interlayer insulating film 1104, a protection film 1106, an etching stopper film 1108, an interlayer insulating film 1110, an etching stopper film 1112, an interlayer insulating film 1114, a protection film 1116, and an etching stopper film 1118.

As shown in FIG. 15A, the electric fuse 1200 before the cut-off includes a lower-layer wiring 1122, and a via 1151 and an upper-layer 1152 that are formed on the lower-layer wiring 1122. Here, the via 1151 and the upper-layer wiring 1152 are integrally formed as a dual damascene wiring 1154.

The lower-layer wiring 1122 is formed in the etching stopper film 1102, the interlayer insulating film 1104, and the protection film 1106. The via 1151 is formed in the etching stopper film 1108, the interlayer insulating film 1110, and the etching stopper film 1112. The upper-layer wiring 1152 is formed in the etching stopper film 1112, the interlayer insulating film 1114, and the protection film 1116.

The lower-layer wiring 1122, the via 1151, and the upper-layer wiring 1152 are formed with a conductive material such as a copper-containing metal film or the like that contains copper as a main component. The copper-containing metal film may contain silver. The copper-containing metal film may further contain one or two different elements selected from the group consisting of Al, Au, Pt, Cr, Mo, W, Mg, Be, Zn, Pd, Cd, Hg, Si, Zr, Ti, and Sn. The copper-containing metal film may be formed by a plating technique, for example. A silicide film may be formed on the surface of the copper-containing metal film, for example.

Further, a barrier metal film 1120 and a barrier metal film 1150 are formed in contact with the side faces and the bottom faces of the lower-layer wiring 1122 and the dual damascene wiring 1154, so as to cover the side faces and the bottom faces of the lower-layer wiring 1122 and the dual damascene wiring 1154, respectively. The barrier metal film 1120 and the barrier metal film 1150 may contain a high-melting-point metal. The barrier metal films may be formed with Ta, TaN, Ti, TiN, W, WN, or the like.

Accordingly, before the cut-off, the barrier metal film 1150 is formed between and in contact with the lower-layer wiring 1122 and the via 1151.

The interlayer insulating film 1104 and the interlayer insulating film 1114 may be formed with a low-dielectric film such as a SiOC film. The interlayer insulating film 1104 and the interlayer insulating film 1114 may be made of the same material or may be made of different materials from each other.

The interlayer insulating film 1110 may be made of the same material as that mentioned in relation to the interlayer insulating film 1104 and the interlayer insulating film 1114.

In this case, the via 1151 has much smaller area than the wirings in the in-plane direction of the semiconductor substrate, and cracks can be readily formed selectively at the wiring portions.

The etching stopper film 1108 and the etching stopper film 1118 function as the etching stopper films for forming via holes and wiring trenches, and also serve to prevent diffusion of the copper forming the lower-layer wiring 1122 and the upper-layer wiring 1152. In this embodiment, the etching stopper film 1108 and the etching stopper film 1118 also function as the covering film of the electric fuse 1200. The etching stopper film 1108 and the etching stopper film 1118 may be formed with a harder material than the interlayer insulating film 1104 and the interlayer insulating film 1114. The etching stopper film 1108 and the etching stopper film 1118 may be formed with a material having a higher Young's modulus than the interlayer insulating film 1104 and the interlayer insulating film 1114. The etching stopper film 1108 and the etching stopper film 1118 may be formed with SiCN, SiN, SiC, SiOF, SiON, or the like.

The protection film 1106 and the protection film 1116 function to protect the interlayer insulating film 1104 and the interlayer insulating film 1114, when polishing is performed on the lower-layer wiring 1122 and the upper-layer wiring 1152 by chemical mechanical polishing (CMP). The protection film 1106 and the protection film 1116 may be formed with a $SiO_2$ film, for example.

The etching stopper film 1102 and the etching stopper film 1112 may be made of the same material as the etching stopper film 1108 and the etching stopper film 1118. Although not shown in the drawings, the etching stopper film 1102 and the etching stopper film 1112 may be stack films each including a first insulating film made of the same material as the protection film 1106 and the protection film 1116, and a second insulating film formed on the first insulating film made of the same material as the etching stopper film 1108 and the etching stopper film 1118.

The lower-layer wiring 1122, the via 1151, the upper-layer wiring 1152, and the likes having the above described structures can be formed through the same procedures as the procedures used to produce a regular multi-layer wiring structure. Accordingly, the electric fuse 1200 can be formed without an addition of any special procedure.

As described above, the peripheral portions of the dual damascene wiring 1154 are covered with covering films such as the barrier metal film 1150 and the etching stopper film 1118, and the interlayer insulating film 1114 made of a softer material than the covering films is formed around the covering films. The upper-layer wiring 1152 is designed to have a larger area than the via 1151 and the lower-layer wiring 1122 in the in-plane direction of the semiconductor substrate.

Next, the procedures to cut off the electric fuse 1200 having the above structure are described.

When an appropriate amount of power is applied to the electric fuse 1200 by applying a predetermined voltage between the upper-layer wiring 1152 and the lower-layer wiring 1122, the conductive material constituting the upper-layer wiring 1152 of the electric fuse 1200 expands. As the conductive material expands, a crack is formed in the barrier metal film 1150 and the etching stopper film 1118 and the likes, and the conductive material constituting the upper-layer wiring 1152 flows into the surrounding films through the crack. In other words, the conductive material constituting the upper-layer wiring 1152 flows out of the wiring trenches. As a result, a flowing-out portion 1142 is formed, as shown in FIG. 15B.

Furthermore, as the conductive material rapidly moves toward the flowing-out portion 1142, the conductive material is cut at the portion where the movement of the conductive material is too fast to follow the above movement. In this embodiment, the conductive material is cut in the area of the via 1151, and a void 1140 is formed. By this mechanism, a large void 1140 is formed at a location at a certain distance from the flowing-out portion 1142.

Also, since the barrier metal film 1150 is provided between the via 1151 and the lower-layer wiring 1122 in this embodiment, the barrier metal film 1150 has a tendency to be detached from the lower-layer wiring 1122, and the void 1140 has a tendency to be formed between the barrier metal film 1150 and the lower-layer wiring 1122.

Furthermore, in a cut-off state, the conductive material constituting the via 1151 moves together with the barrier metal film 1150, and the void 1140 is formed between the barrier metal film 1150 and the lower-layer wiring 1122. Accordingly, even if a heat treatment or the like is performed after this procedure, the barrier metal film 1150 and the conductive material of a copper-containing metal film can be prevented from moving again and causing a reconnection with the lower-layer wiring 1122. Thus, the heat resistance of the semiconductor device 1100 can be increased.

By cutting off the electric fuse 1200 by the crack assist type process according to the above mechanism, the void 1140 is inevitably formed in a different region from the flowing-out portion 1142. Thus, a reconnection of the electric fuse 1200 can be prevented.

The electric fuse 1200 that is cut off by the crack assist type process has higher heat resistance than an electric fuse that utilizes electromigration. However, to cope with a device that requires higher reliability such as an in-vehicle device, higher heat resistance is necessary. Particularly, when excessive heat is generated by applying an appropriate voltage to the electric fuse 1200 and forming the void 1140 in the electric fuse 1200, the interlayer insulating films located in the vicinity of the via 1151 might disappear. Also, unintended cracks are sometimes formed in the lower interlayer insulating film due to excessive heat generated in the upper-layer wiring 1152. If these two phenomena are caused in one electric fuse 1200 and thermal stress is applied to the electric fuse, the conductive material constituting the wiring flows out from the upper-layer wiring 1152 to the portion where the lower interlayer insulating films have disappeared. The conductive material causes to electrically connect the upper-layer wiring 1152 and the lower-layer wiring 1122, and a current path that bypasses the void 1140 formed in the via 1151 is formed. As a result, the resistance of the electric fuse 1200 that has high resistance after cut off becomes low, and the program information is destroyed.

In the following embodiments, heat diffusion wirings are provided around the main body of an electric fuse (the upper-layer wiring or the lower-layer wiring), and the heat diffusion wirings are electrically connected to the electric fuse. More specifically, a heat diffusion portion that includes a heat diffusion wiring electrically connected to the upper-layer wiring or the lower-layer wiring of an electric fuse is provided in the same layer of the at least one of the upper-layer wiring and the lower-layer wiring, and is placed on a side of the upper-layer wiring or the lower-layer wiring. Here, the heat diffusion wiring may be formed on a side of the upper-layer wiring or the lower-layer wiring at the portion where the upper-layer wiring or the lower-layer wiring is connected to the via. Further, the heat diffusion wiring may be provided along with, in this case in parallel with, the upper-layer wiring or the lower-layer wiring.

With this arrangement, the heat generated in the electric fuse can be released to the heat diffusion wiring, and an excessive temperature rise in the electric fuse can be prevented. In the following embodiments, cracks are preferentially formed in the upper-layer wiring, and it is more desirable that cracks are formed only at the upper portion of the upper-layer wiring. In a case where a heat diffusion wiring is provided in the vicinity of the upper-layer wiring and is connected to the upper-layer wiring, an excessive temperature rise in the upper-layer wiring can be prevented, and crack formation at the lower portions can be effectively prevented. On the other hand, in a case where a heat diffusion wiring is provided around the lower-layer wiring and is connected to the lower-layer wiring, interlayer insulating film loss due to an abnormal heat generation in the lower-layer wiring and at the bottom portion of the via can be effectively prevented. The lower-layer wiring easily releases heat, being closer to the substrate. By providing the heat diffusion portion, heat release is facilitated. Accordingly, the region surrounding the via is exposed to a high temperature for a shorter period of time. Thus, the interlayer insulating films can be prevented from disappearing. In either case, the cause of lowering the resistance because of a short-circuiting can be reduced, and higher reliability can be achieved. Here, each heat diffusion wiring may be designed to have a larger thermal capacity than the upper-layer wiring and the lower-layer wiring of the electric fuse.

First Embodiment

The following is a description of the structure of a semiconductor device in accordance with this embodiment.

Figure 2A:
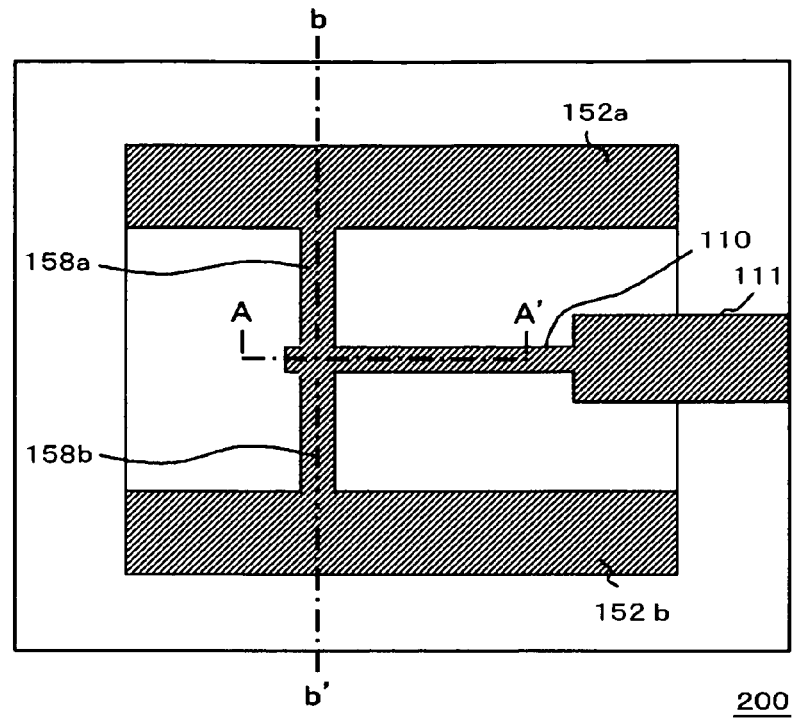
FIGS. 2A and 2B are schematic plan views showing the example structure of the semiconductor device including the electric fuse in accordance with the embodiment.
Figure 2B:
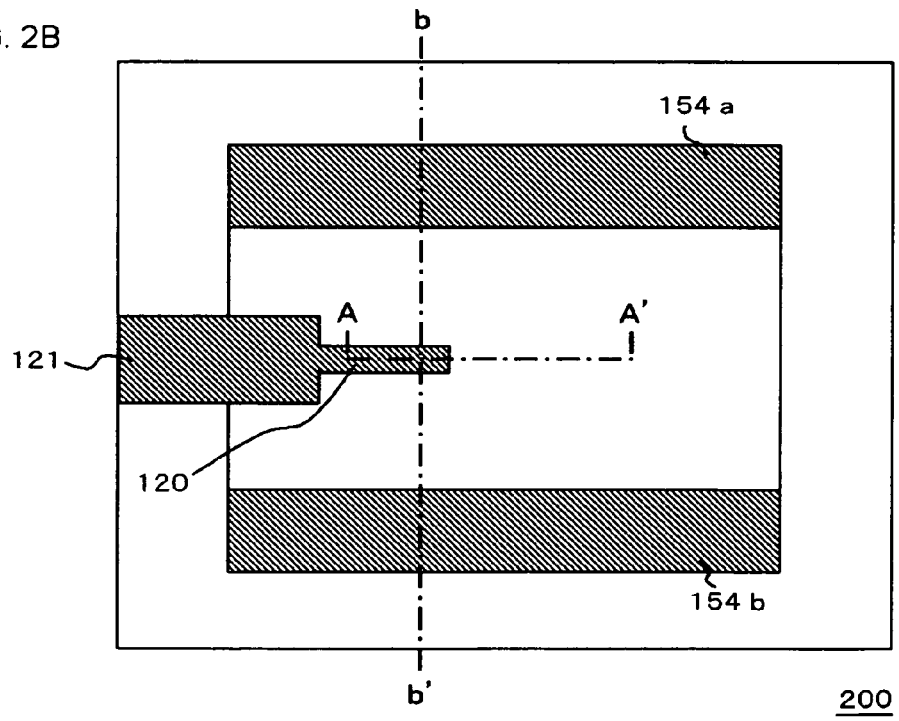
Figure 3:
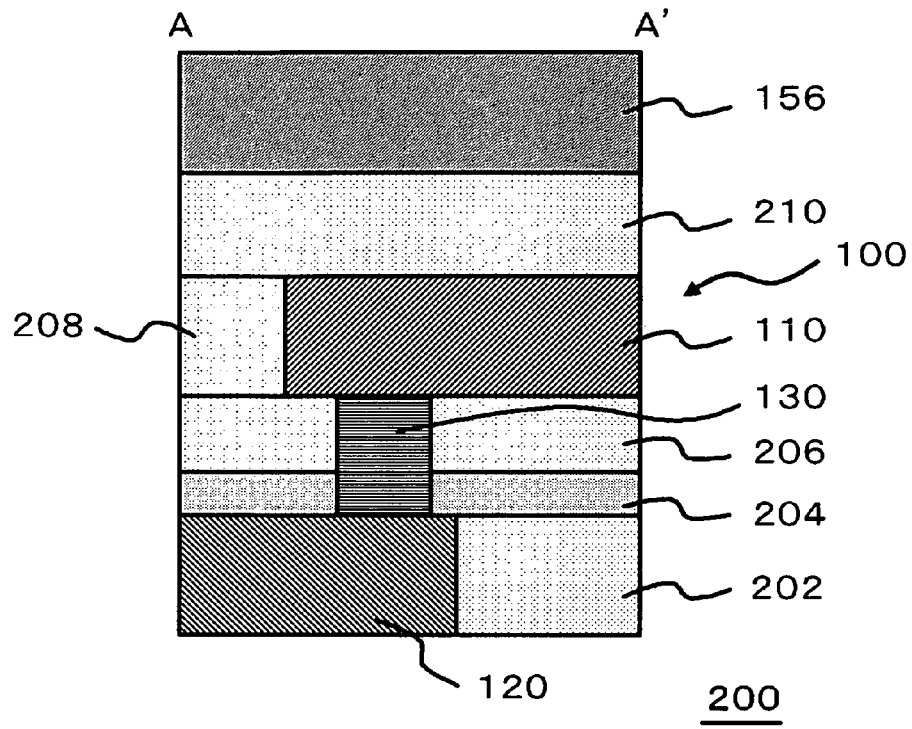
FIG. 3 is a cross-sectional view of the semiconductor device, taken along the line A-A' of FIG. 1.
Figure 4:
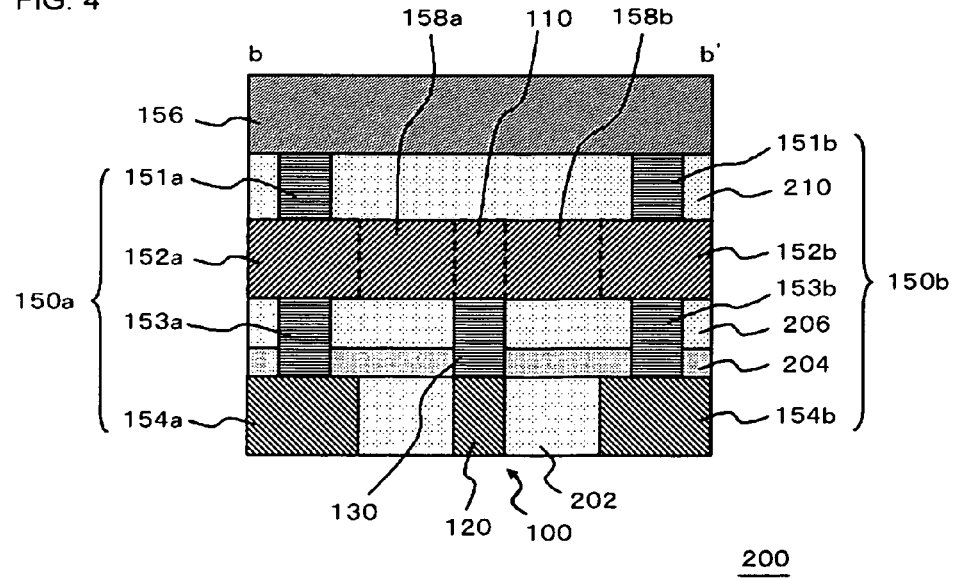
FIG. 4 is a cross-sectional view of the semiconductor device, taken along the line b-b' of FIG. 1.

FIG. 1 and FIGS. 2A and 2B are schematic plan views showing an example structure of an electric fuse 100 in this embodiment. FIGS. 3 and 4 are cross-sectional views of the electric fuse 100 of FIG. 1. FIG. 3 is a cross-sectional view of the electric fuse 100, taken along the line A-A' of FIG. 1. FIG. 4 is a cross-sectional view of the electric fuse 100, taken along the line b-b' of FIG. 1.

A semiconductor device 200 includes the electric fuse 100 formed on a semiconductor substrate (substrate, not shown) such as a silicon substrate. For ease of explanation, FIG. 1 shows an upper-layer wiring 110, a via 130, and a lower-layer wiring 120. FIG. 2A is a plan view of the structure of the layer having the upper-layer wiring 110 formed therein. FIG. 2B is a plan view of the structure of the layer having the lower-layer wiring 120 formed therein.

The electric fuse 100 includes the upper-layer wiring 110, the lower-layer wiring 120, and the via 130 connecting the upper-layer wiring 110 and the lower-layer wiring 120. In this embodiment, the electric fuse 100 may have the same structure as the electric fuse 1200 illustrated in FIGS. 15A and 15B. For example, the lower-layer wiring 120, the via 130, and the upper-layer wiring 110 may have the same structures as the lower-layer wiring 1122, the via 1151, and the upper-layer wiring 1152, respectively. Accordingly, the lower-layer wiring 120, the via 130, and the upper-layer wiring 110 may be formed with copper-containing metal film. Although not shown in the drawings, the same barrier metal films as the barrier metal film 1120 and the barrier metal film 1150 may be provided on the side faces and the bottom faces of the lower-layer wiring 120, the via 130, and the upper-layer wiring 110.

In this embodiment, the upper-layer wiring 110 is controlled to expand at a higher rate than the lower wiring 120, so as to cause a flowing-out of a conductive material in the upper-layer wiring 110. Therefore, the upper-layer wiring 110 is designed to have a larger volume than the lower-layer wiring 120. For example, the upper-layer wiring 110 may be longer than the lower-layer wiring 120 at the portions of the upper-layer wiring 110 and the lower-layer wiring 120 connected to the via 130, and the portions thinner than the other portions. However, such an arrangement is merely an example, and any other arrangement may be employed as long as the upper-layer wiring 110 can expand more readily than the lower-layer wiring 120. Accordingly, cracks are readily formed around the upper-layer wiring 110 when the electric fuse 100 is cut off. The upper-layer wiring 110 is connected to an upper-layer terminal 111 formed on the same layer. The lower-layer wiring 120 is connected to a lower-layer terminal 121 formed on the same layer. The upper-layer terminal 111 and the lower-layer terminal 121 may be made of the same materials as the upper-layer wiring 110 and the lower-layer wiring 120, respectively.

In this embodiment, the electric fuse 100 is placed in the semiconductor device 200. As shown in FIG. 3, the semiconductor device 200 has a structure in which an interlayer insulating film 202, an etching stopper film 204, an interlayer insulating film 206, an interlayer insulating film 208, and an interlayer insulating film 210 are stacked in this order. In FIG. 3, the protection film and the etching stopper film are partially not shown, but those stack films may also be the same as those illustrated in FIGS. 15A and 15B.

The lower-layer wiring 120 is formed in the interlayer insulating film 202. The via 130 is formed in the etching stopper film 204 and the interlayer insulating film 206. The upper-layer wiring 110 is formed in the interlayer insulating film 208. Although the via 130 and the upper-layer wiring 110 are shown separately from each other, a dual damascene structure may be employed like the dual damascene wiring 1154 shown in FIGS. 15A and 15B.

In this embodiment, the semiconductor device 200 includes a heat diffusion portion 150a, a heat diffusion portion 150b, and an upper plate electrode 156. The heat diffusion portion 150a, the heat diffusion portion 150b, and the upper plate electrode 156 may be made of conductive materials. The heat diffusion portion 150a and the heat diffusion portion 150b may be formed symmetrically with respect to the A-A' line of FIG. 1.

In this embodiment, the heat diffusion portion 150a includes a connection wiring 158a, a heat diffusion upper-layer wiring 152a, a heat diffusion lower-layer via 153a, a heat diffusion lower-layer wiring 154a, and a heat diffusion upper-layer via 151a, as shown in FIG. 4. The heat diffusion portion 150b includes a connection wiring 158b, a heat diffusion upper-layer wiring 152b, a heat diffusion lower-layer via 153b, a heat diffusion lower-layer wiring 154b, and a heat diffusion upper-layer via 151b.

The connection wiring 158a and the heat diffusion upper-layer wiring 152a, and the connection wiring 158b and the heat diffusion upper-layer wiring 152b are formed in the same layer as the upper-layer wiring 110. The heat diffusion lower-layer via 153a and the heat diffusion lower-layer via 153b are formed in the same layer as the via 130. The heat diffusion lower-layer wiring 154a and the heat diffusion lower-layer wiring 154b are formed in the same layer as the lower-layer wiring 120. The heat diffusion upper-layer via 151a and the heat diffusion upper-layer via 151b are formed on the heat diffusion upper-layer wiring 152a and the heat diffusion upper-layer wiring 152b, respectively. The upper plate electrode 156 is formed on the heat diffusion upper-layer via 151a and the heat diffusion upper-layer via 151b.

As shown in FIG. 2A, the heat diffusion upper-layer wiring 152a is formed on a side of the upper-layer wiring 110. The connection wiring 158a connects the heat diffusion upper-layer wiring 152a and the upper-layer wiring 110. Likewise, the heat diffusion upper-layer wiring 152b is formed on a side of the upper-layer wiring 110. The connection wiring 158b connects the heat diffusion upper-layer wiring 152b and the upper-layer wiring 110. The upper-layer wiring 110 is interposed between the heat diffusion upper-layer wiring 152a and the heat diffusion upper-layer wiring 152b. In this embodiment, the heat diffusion portion 150a and the heat diffusion portion 150b are electrically connected to the upper-layer wiring 110. The upper plate electrode 156 is electrically connected to the heat diffusion portion 150a and the heat diffusion portion 150b. Accordingly, the heat diffusion portion 150a, the heat diffusion portion 150b, and the upper plate electrode 156 have the same electric potential as the upper-layer wiring 110. In other words, the upper plate electrode 156 functions as part of the heat diffusion portions in this embodiment.

The heat diffusion lower-layer via 153a, the heat diffusion lower-layer wiring 154a, and the heat diffusion upper-layer via 151a are placed in such positions as to overlap with at least part of the heat diffusion upper-layer wiring 152a, when seen in a plan view. Likewise, the heat diffusion lower-layer via 153b, the heat diffusion lower-layer wiring 154b, and the heat diffusion upper-layer via 151b are placed in such positions as to overlap with at least part of the heat diffusion upper-layer wiring 152b, when seen in a plan view. In this embodiment, the connection wiring 158a and the connection wiring 158b are formed on the same straight line, and may be arranged perpendicularly to the upper-layer wiring 110. In this embodiment, the via 130 is connected to the upper-layer wiring 110 at the location where the upper-layer wiring 110 meets the connection wiring 158a and the connection wiring 158b. Further, the connection wiring 158a and the connection wiring 158b have greater widths than the upper-layer wiring 110. Accordingly, the effect of the electric fuse to release heat from the upper-layer wiring can be further increased.

In this embodiment, the heat diffusion upper-layer wiring 152a and the heat diffusion upper-layer wiring 152b are designed in a straight line when seen in a plan view. The heat diffusion upper-layer wiring 152a and the heat diffusion upper-layer wiring 152b are also arranged substantially parallel to the upper-layer wiring 110. Further, the heat diffusion lower-layer wiring 154a is designed to have the same shape as the heat diffusion upper-layer wiring 152a, when seen in a plan view. Likewise, the heat diffusion lower-layer wiring 154b is designed to have the same shape as the heat diffusion upper-layer wiring 152b, when seen in a plan view.

In this embodiment, the heat diffusion portion 150a and the heat diffusion portion 150b are formed on both sides of the electric fuse 100, and are placed over the layer having the lower-layer wiring 120 formed therein to the layer having the upper-layer wiring 110 formed therein. The heat diffusion portion 150a and the heat diffusion portion 150b are further formed on the layers above those layers. Accordingly, the heat diffusion portion 150a and the heat diffusion portion 150b can also function as guard rings.

In the semiconductor device 200 in accordance with this embodiment, the heat diffusion portion 150a and the heat diffusion portion 150b are formed around the electric fuse 100. Accordingly, the heat generated from the electric fuse 100 can escape to the heat diffusion portion 150a and the heat diffusion portion 150b having larger heat capacity, and an excessive temperature increase in the electric fuse 100 can be prevented.

Figure 14:
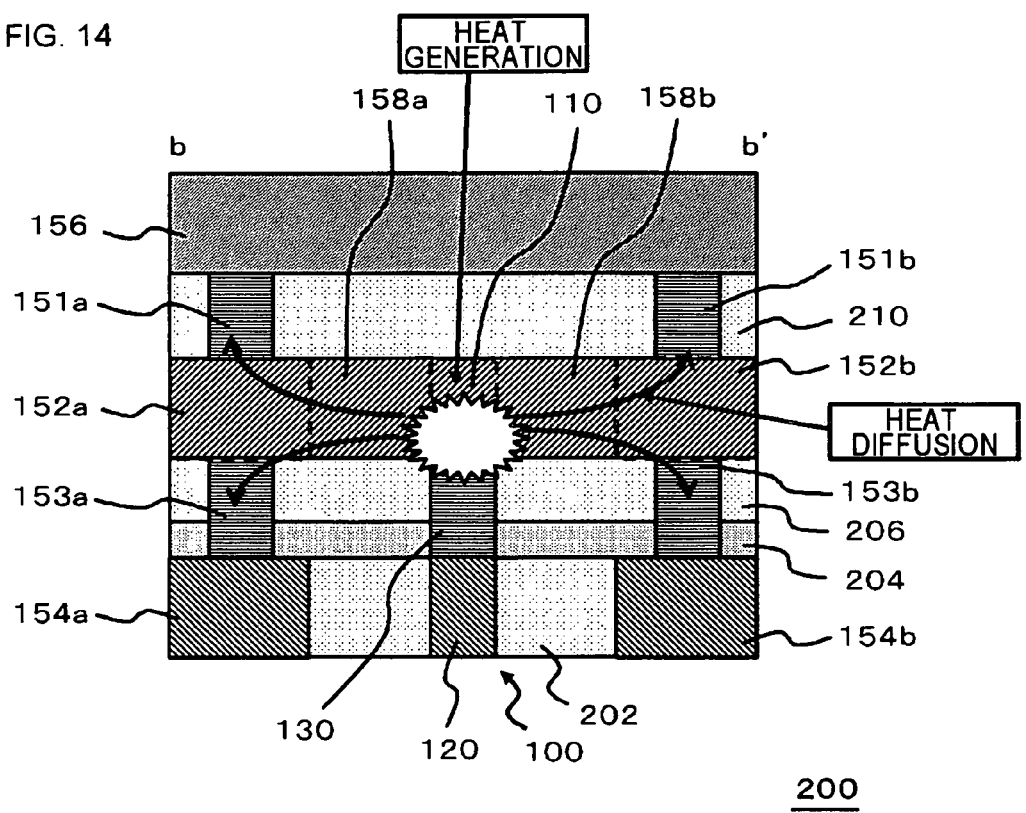
FIG. 14 is a cross-sectional view for explaining the effects of a semiconductor device including an electric fuse in accordance with each embodiment of the present invention.

FIG. 14 is a cross-sectional view illustrating the effects of the electric fuse 100 in this embodiment. Since the heat diffusion upper-layer wiring 152a and the heat diffusion upper-layer wiring 152b are electrically connected to the upper-layer wiring 110 in this embodiment, the heat generated in the electric fuse 100 when the electric fuse 100 is cut off can escape to the heat diffusion upper-layer wiring 152a and the heat diffusion upper-layer wiring 152b. Accordingly, an excessive temperature increase in the electric fuse 100 can be prevented. Thus, an abnormal temperature increase in the upper-layer wiring 110 can be prevented, and it is also to prevent interlayer insulating film loss around the via 130 and formation of cracks in the lower portions. As a result, the cause of lower resistance even after the electric fuse 100 is cut can be reduced, and high reliability can be achieved. Although the upper-layer wiring 110 is connected to the heat diffusion upper-layer wiring 152a and the heat diffusion upper-layer wiring 152b in this embodiment, the lower-layer wiring 120 may be connected to the heat diffusion lower-layer wiring 154a and the heat diffusion lower-layer wiring 154b.

Second Embodiment

Figure 5:
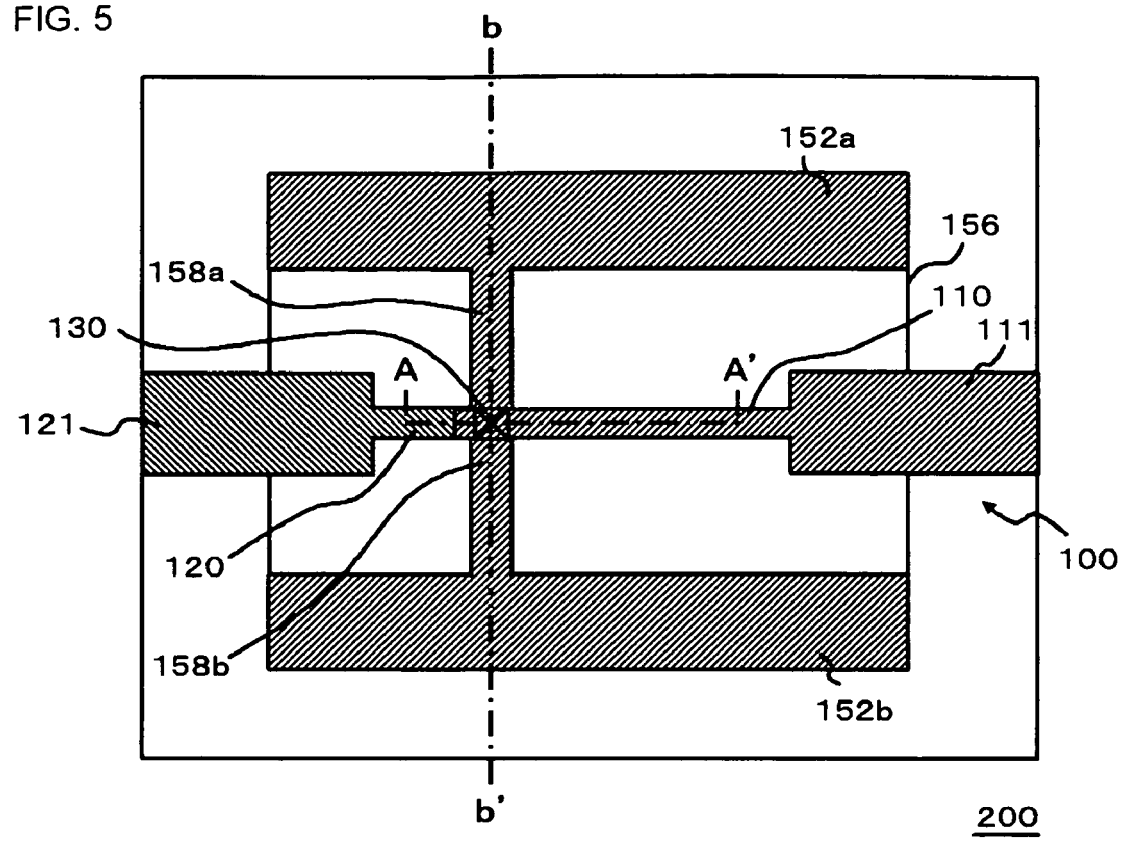
FIG. 5 is a schematic plan view showing an example structure of a semiconductor device including an electric fuse in accordance with another embodiment of the present invention.
Figure 6A:
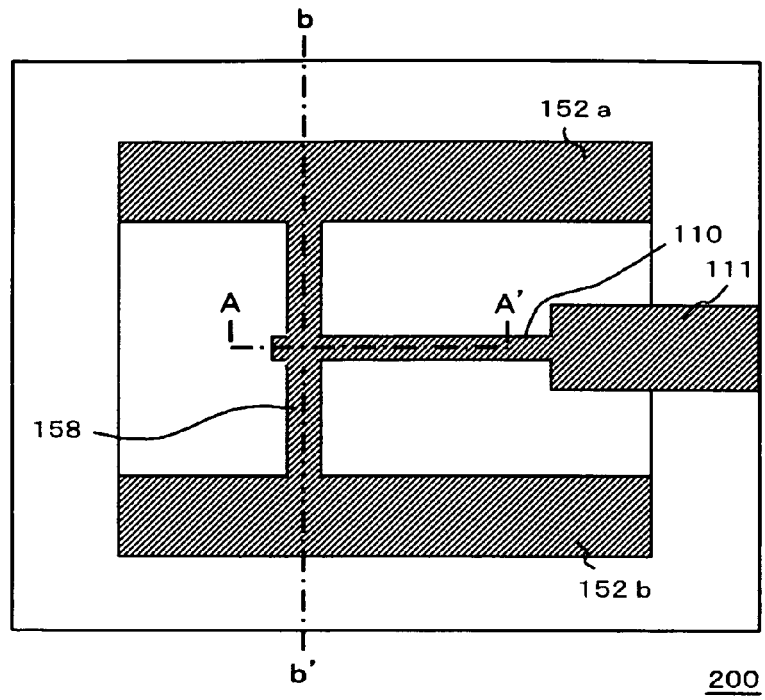
FIGS. 6A and 6B are schematic plan views showing the example structure of the semiconductor device including the electric fuse in accordance with the embodiment.
Figure 6B:
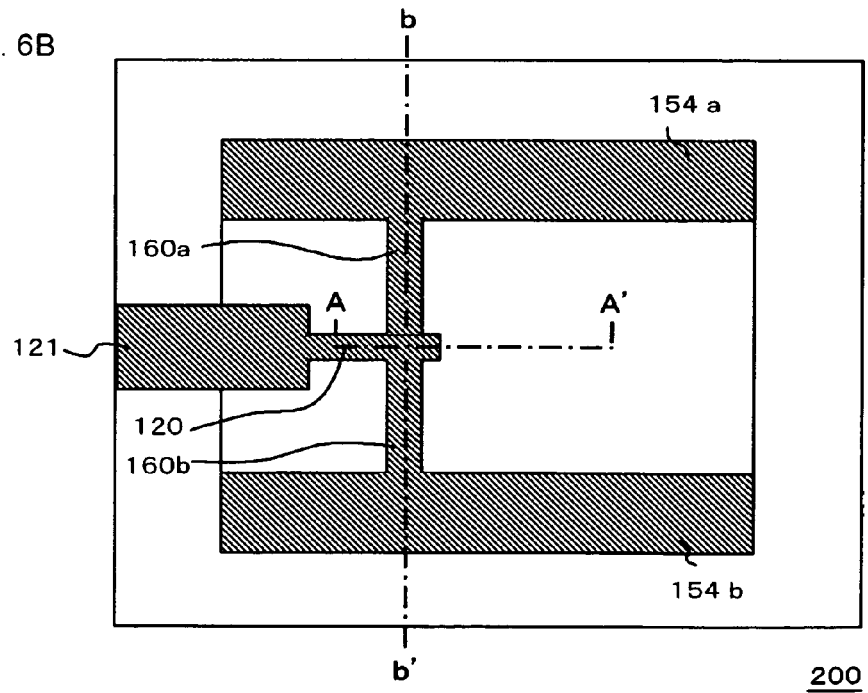
Figure 7:
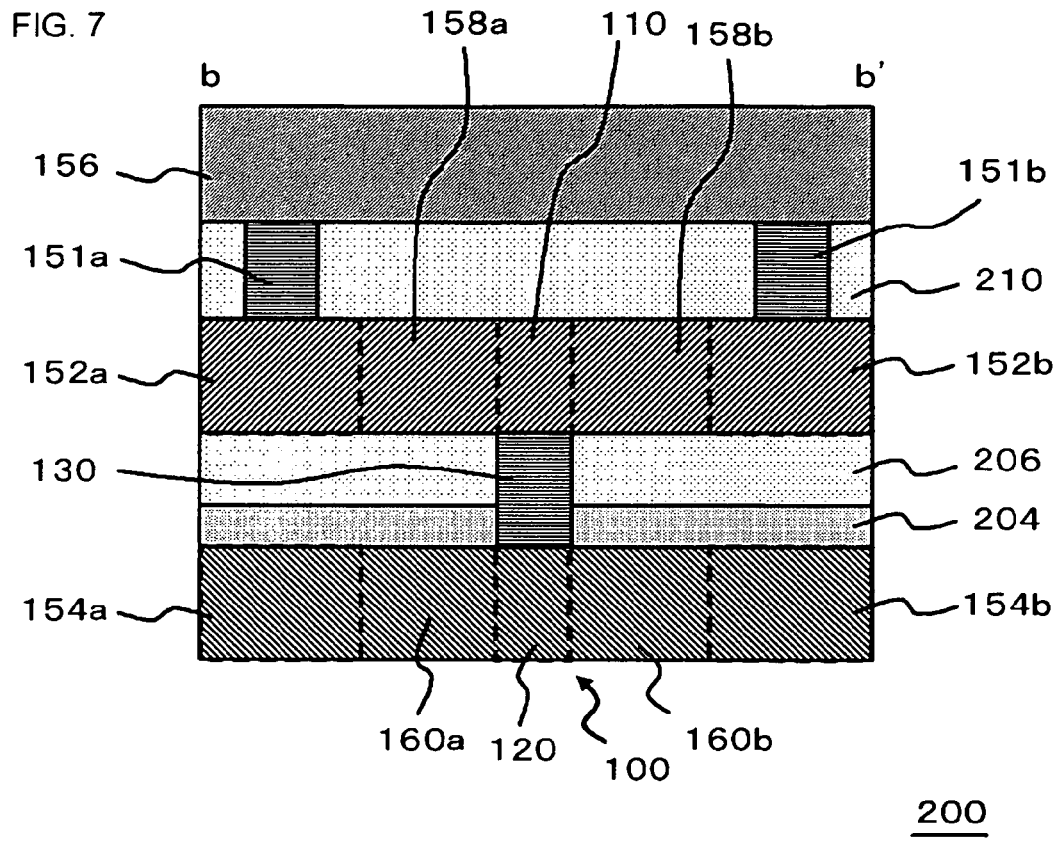
FIG. 7 is a cross-sectional view of the semiconductor device, taken along the line b-b' of FIG. 5.

FIG. 5 and FIGS. 6A and 6B are schematic plan views showing an example structure of a semiconductor device 200 in accordance with this embodiment. FIG. 7 is a cross-sectional view of the semiconductor device 200, taken along the line b-b' of FIG. 5.

For ease of explanation, FIG. 5 shows the upper-layer wiring 110, the via 130, and the lower-layer wiring 120. FIG. 6A is a plan view of the structure of the layer having the upper-layer wiring 110 formed therein. FIG. 6B is a plan view of the structure of the layer having the lower-layer wiring 120 formed therein.

This embodiment differs from the first embodiment in that the heat diffusion lower-layer wiring 154a and the heat diffusion lower-layer wiring 154b formed on both sides of the lower-layer wiring 120 are electrically connected to the lower-layer wiring 120. The heat diffusion lower-layer wiring 154a is electrically connected to the lower-layer wiring 120 via a connection wiring 160a. The heat diffusion lower-layer wiring 154b is electrically connected to the lower-layer wiring 120 via a connection wiring 160b. In this embodiment, the connection wiring 160a and the connection wiring 160b are formed on the same straight line, and may be arranged perpendicularly to the lower-layer wiring 120.

In this embodiment, the layer having the upper-layer wiring 110 formed therein may have the same structure as that of the first embodiment. In this embodiment, the location at which the upper-layer wiring 110 meets the connection wiring 158a and the connection wiring 158b may overlap with the location at which the lower-layer wiring 120 meets the connection wiring 160a and the connection wiring 160b, when seen in a plan view. The via 130 is connected to the upper-layer wiring 110 and the lower-layer wiring 120 at the meeting locations. Further, the connection wiring 160a and the connection wiring 160b have greater widths than the lower-layer wiring 120. Accordingly, the heat releasing effects of not only the upper-layer wiring 110 but also the lower-layer wiring 120 and the bottom portion of the via 130 can be further increased, and the inside of the via 130 can be warmed in a restrictive manner. As a result, more precise cutting can be performed at the via 130.

In this embodiment, the heat diffusion lower-layer wiring 154a is not electrically connected directly to the heat diffusion upper-layer wiring 152a. Also, the heat diffusion lower-layer wiring 154b is not electrically connected directly to the heat diffusion upper-layer wiring 152b. In this embodiment, the upper-layer wiring 110 and the lower-layer wiring 120 are electrically connected only by the via 130 before cut-off. By forming a cut-off point at the via 130, the upper-layer wiring 110 and the lower-layer wiring 120 can be electrically separated from each other after the cut-off. To cause the electric fuse 100 to function properly, cutting is performed only at the via portion as explained in the first embodiment. Even after the cut-off, the heat diffusion upper-layer wiring 152a, the heat diffusion upper-layer via 151a, the upper plate electrode 156, the heat diffusion upper-layer wiring 152b, and the heat diffusion upper-layer via 151b have the same electric potential as the upper-layer wiring 110. Meanwhile, the heat diffusion lower-layer wiring 154a and the heat diffusion lower-layer wiring 154b have the same electric potential as the lower-layer wiring 120.

In this embodiment, the connection wiring 158a, the heat diffusion upper-layer wiring 152a and the heat diffusion upper-layer via 151a, the connection wiring 158b, the heat diffusion upper-layer wiring 152b and the heat diffusion upper-layer via 151b, the connection wiring 160a and the heat diffusion lower-layer wiring 154a, and the connection wiring 160b and the heat diffusion lower-layer wiring 154b function as heat diffusion portions. The upper plate electrode 156 also functions as part of the heat diffusion portions.

In this embodiment, the same effects as those of the first embodiment can be achieved.

Third Embodiment

Figure 8:
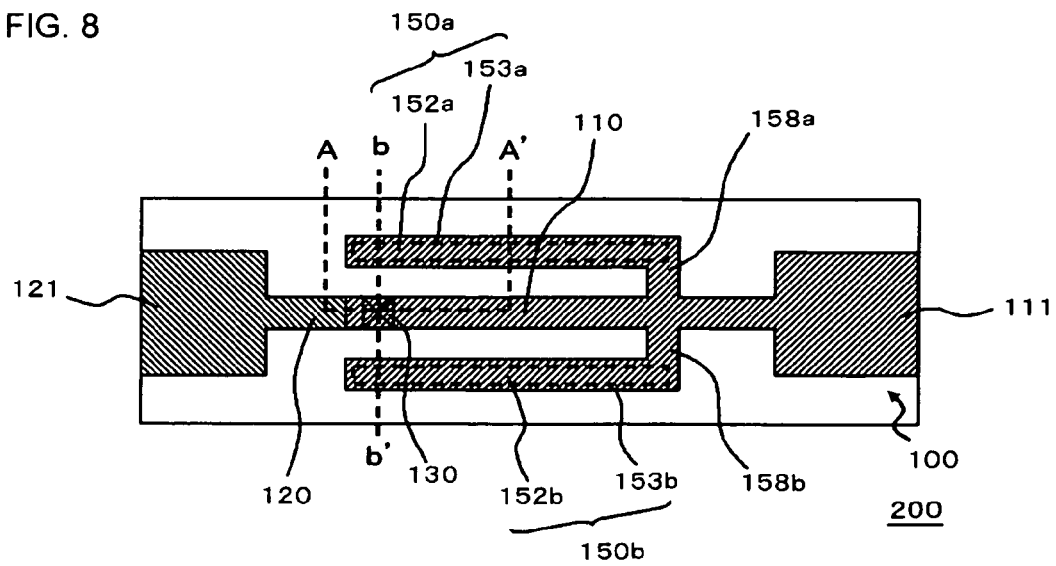
FIG. 8 is a schematic plan view showing an example structure of a semiconductor device including an electric fuse in accordance with yet another embodiment of the present invention.
Figure 9A:
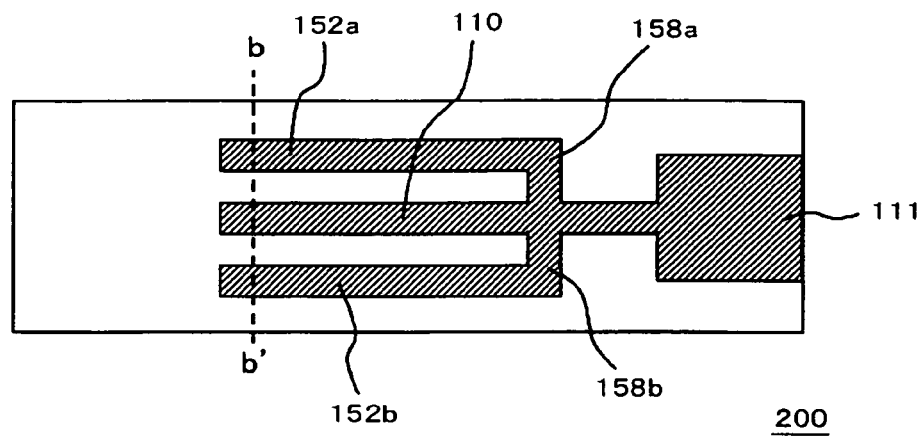
FIGS. 9A and 9B are schematic plan views showing the example structure of the semiconductor device including the electric fuse in accordance with the embodiment.
Figure 9B:
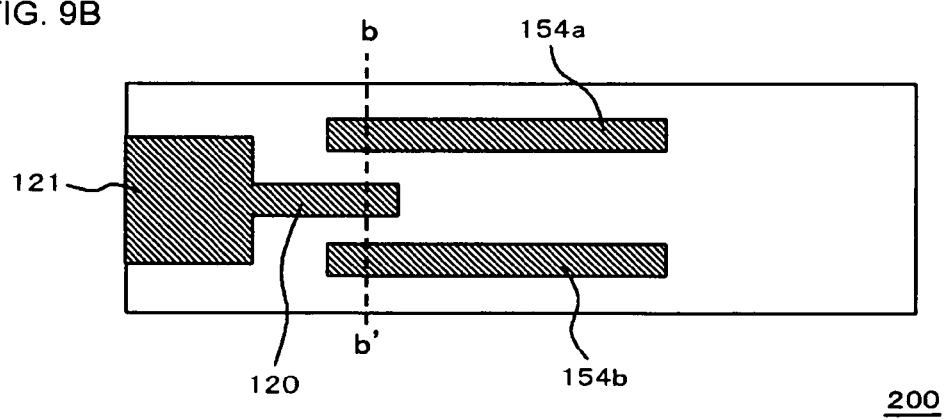

FIG. 8 and FIGS. 9A and 9B are schematic plan views showing an example structure of a semiconductor device 200 in accordance with this embodiment. This embodiment differs from the first embodiment in the locations where the connection wiring 158a and the connection wiring 158b are connected to the upper-layer wiring 110. In this embodiment, the connection wiring 158a and the connection wiring 158b are connected to the upper-layer wiring 110 at a location that is closer to the upper-layer terminal 111 than to the location where the upper-layer wiring 110 is connected to the via 130.

Figure 10:
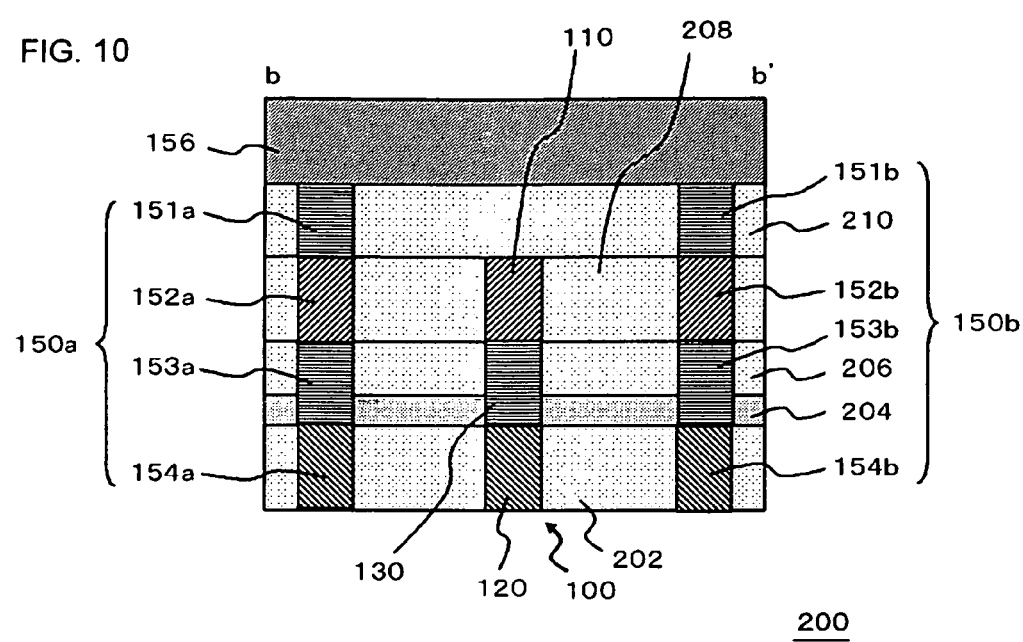
FIG. 10 is a cross-sectional view of the semiconductor device, taken along the line b-b' of FIG. 8.

For ease of explanation, FIG. 8 shows the upper-layer wiring 110, the via 130, and the lower-layer wiring 120. FIG. 9A is a plan view of the structure of the layer having the upper-layer wiring 110 formed therein. FIG. 9B is a plan view of the structure of the layer having the lower-layer wiring 120 formed therein. In this embodiment, a cross-sectional view taken along the line A-A' of FIG. 8 is the same as the cross-sectional view shown in FIG. 3. FIG. 10 is a cross-sectional view of the semiconductor device 200, taken along the line b-b' of FIG. 8.

As in the first embodiment, the connection wiring 158a, the heat diffusion upper-layer wiring 152a, the heat diffusion lower-layer via 153a, the heat diffusion lower-layer wiring 154a, and the heat diffusion upper-layer via 151a constitute the heat diffusion portion 150a in this embodiment. Also, the connection wiring 158b, the heat diffusion upper-layer wiring 152b, the heat diffusion lower-layer via 153b, the heat diffusion lower-layer wiring 154b, and the heat diffusion upper-layer via 151b constitute the heat diffusion portion 150b. The heat diffusion portion 150a and the heat diffusion portion 150b are electrically connected to the upper-layer wiring 110. The upper plate electrode 156 is electrically connected to the heat diffusion portion 150a and the heat diffusion portion 150b. Accordingly, the heat diffusion portion 150a, the heat diffusion portion 150b, and the upper plate electrode 156 have the same electric potential as the upper-layer wiring 110. Thus, the upper plate electrode 156 also functions as part of the heat diffusion portions in this embodiment. Alternatively, the heat diffusion portions may only include the heat diffusion upper-layer wiring 152a, the connection wiring 158a, the heat diffusion upper-layer wiring 152b, and the connection wiring 158b.

As described in the first embodiment, the connection wiring 158a and the connection wiring 158b are connected at the location where the upper-layer wiring is connected to the via 130, so that the heat releasing effects of the heat diffusion portion 150a and the heat diffusion portion 150b can be increased. To cut off the electric fuse 100, it is necessary to apply a certain amount of heat to the electric fuse 100. If the heat releasing effects are too large, it might become difficult to cut off the electric fuse 100. In accordance with the usage environment of the semiconductor device 200 including the electric fuse 100 and the layout of the other elements in the semiconductor device 200, the locations of the connection wiring 158a and the connection wiring 158b can be arbitrarily determined.

Fourth Embodiment

Figure 11A:
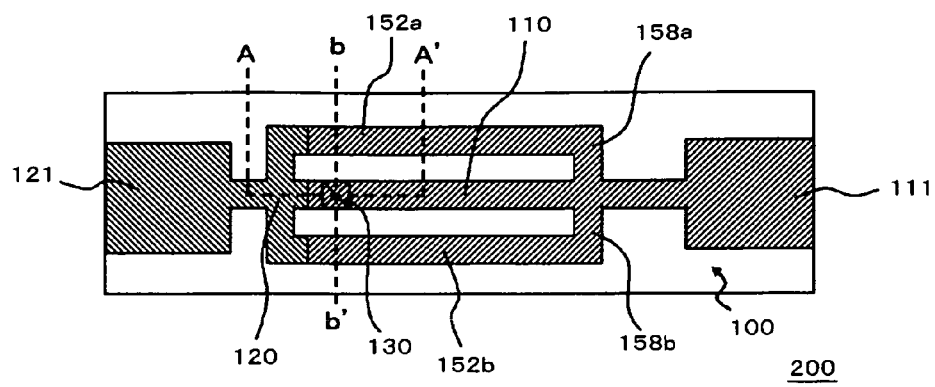
FIGS. 11A through 11C are schematic plan views showing an example structure of a semiconductor device including an electric fuse in accordance with still another embodiment of the present invention.
Figure 11B:
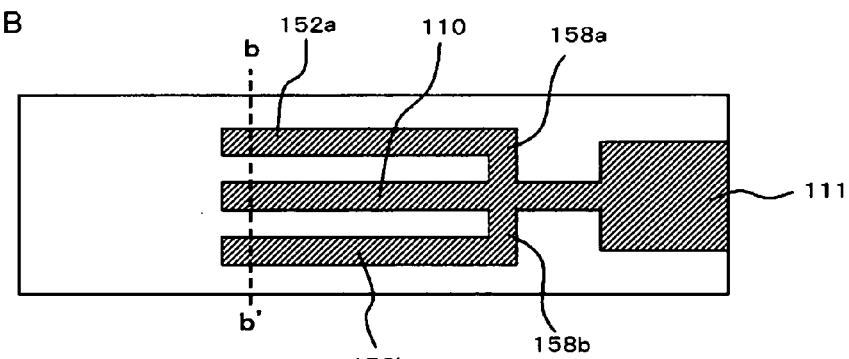
Figure 11C:
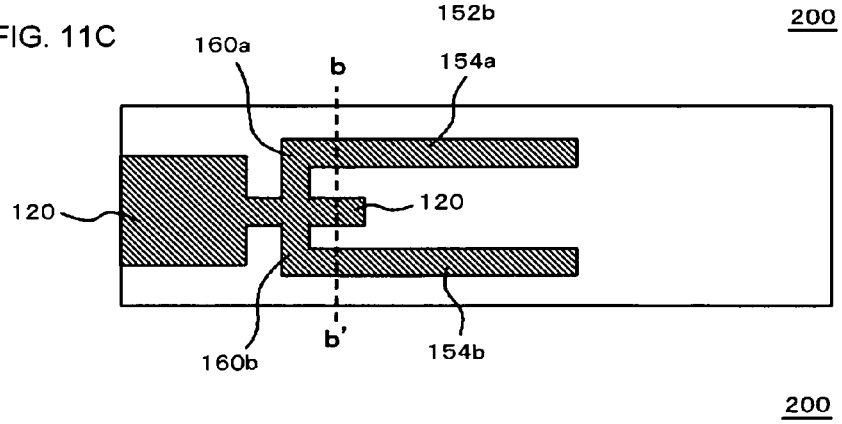

FIGS. 11A through 11C are schematic plan views showing an example structure of a semiconductor device 200 in accordance with this embodiment.

For ease of explanation, FIG. 11A shows the upper-layer wiring 110, the via 130, and the lower-layer wiring 120. FIG. 11B is a plan view of the structure of the layer having the upper-layer wiring 110 formed therein. FIG. 11C is a plan view of the structure of the layer having the lower-layer wiring 120 formed therein.

This embodiment differs from the third embodiment in that the heat diffusion lower-layer wiring 154a and the heat diffusion lower-layer wiring 154b formed on both sides of the lower-layer wiring 120 are electrically connected to the lower-layer wiring 120. This embodiment also differs from the second embodiment in the locations where the connection wiring 160a and the connection wiring 160b are connected to the lower-layer wiring 120.

Figure 12:
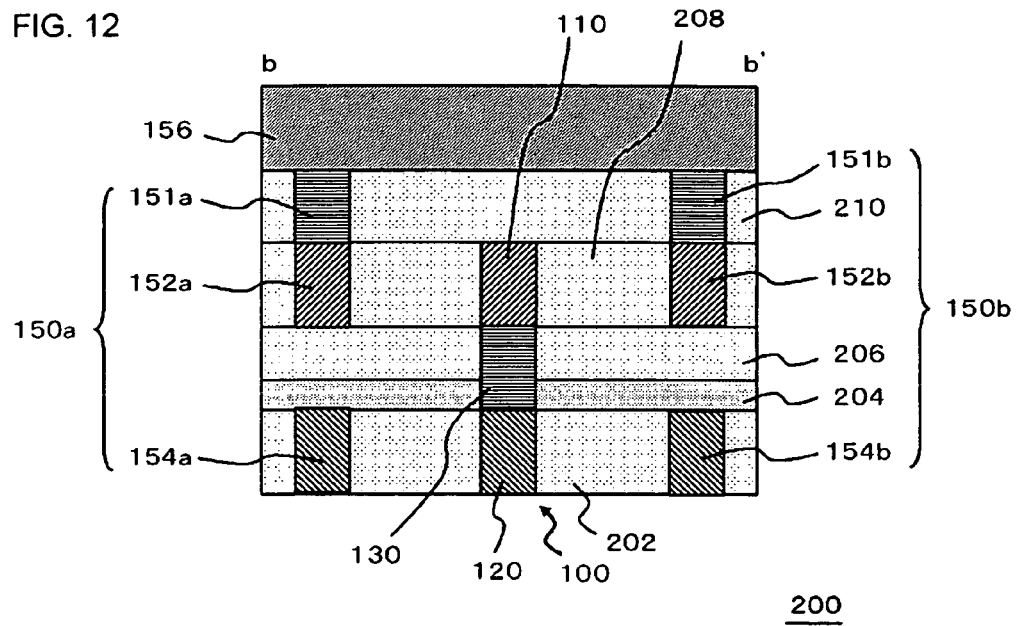
FIG. 12 is a cross-sectional view of the semiconductor device, taken along the line b-b' of FIGS. 11A through 11C.

In this embodiment, a cross-sectional view taken along the line A-A' of FIG. 11A is also the same as the cross-sectional view shown in FIG. 3. FIG. 12 is a cross-sectional view of the semiconductor device 200, taken along the line b-b' of FIG. 11A.

In this embodiment, the heat diffusion lower-layer wiring 154a is not electrically connected directly to the heat diffusion upper-layer wiring 152a. Also, the heat diffusion lower-layer wiring 154b is not electrically connected directly to the heat diffusion upper-layer wiring 152b. In this embodiment, the upper-layer wiring 110 and the lower-layer wiring 120 are electrically connected only by the via 130 before cut-off. By forming a cut-off point at the via 130, the upper-layer wiring 110 and the lower-layer wiring 120 can be electrically separated from each other after the cut-off. To cause the electric fuse 100 to function properly, cutting is performed only at the via portion as explained in the previous embodiments. Even after the cut-off, the heat diffusion upper-layer wiring 152a, the heat diffusion upper-layer via 151a, the upper plate electrode 156, the heat diffusion upper-layer wiring 152b, and the heat diffusion upper-layer via 151b have the same electric potential as the upper-layer wiring 110. Meanwhile, the heat diffusion lower-layer wiring 154a and the heat diffusion lower-layer wiring 154b have the same electric potential as the lower-layer wiring 120.

In this embodiment, the connection wiring 158a, the heat diffusion upper-layer wiring 152a and the heat diffusion upper-layer via 151a, the connection wiring 158b, the heat diffusion upper-layer wiring 152b and the heat diffusion upper-layer via 151b, the connection wiring 160a and the heat diffusion lower-layer wiring 154a, and the connection wiring 160b and the heat diffusion lower-layer wiring 154b function as heat diffusion portions. The upper plate electrode 156 also functions as part of the heat diffusion portions. Alternatively, the heat diffusion portions may only include the heat diffusion upper-layer wiring 152a, the connection wiring 158a, the heat diffusion upper-layer wiring 152b, the connection wiring 158b, the connection wiring 160a and the heat diffusion lower-layer wiring 154a, and the connection wiring 160b and the heat diffusion lower-layer wiring 154b.

Fifth Embodiment

Figure 16:
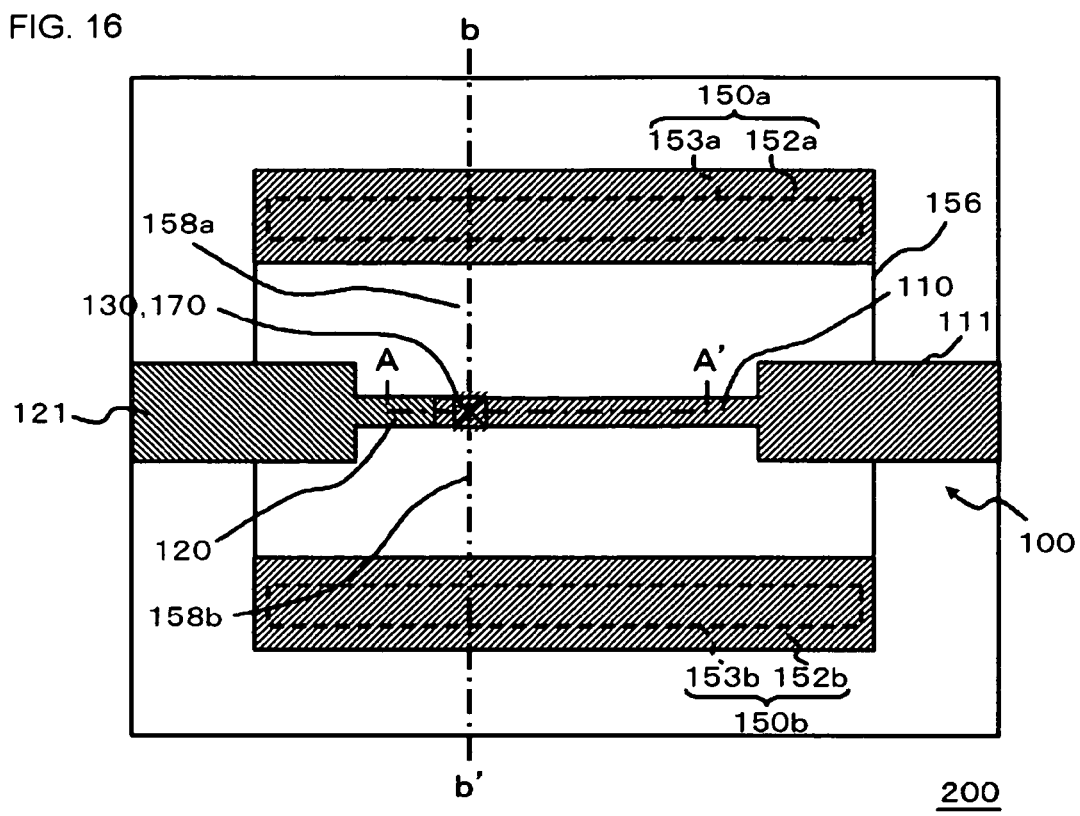
FIG. 16 is a schematic plan view showing an example structure of a semiconductor device including an electric fuse in accordance with still another embodiment of the present invention.
Figure 17:
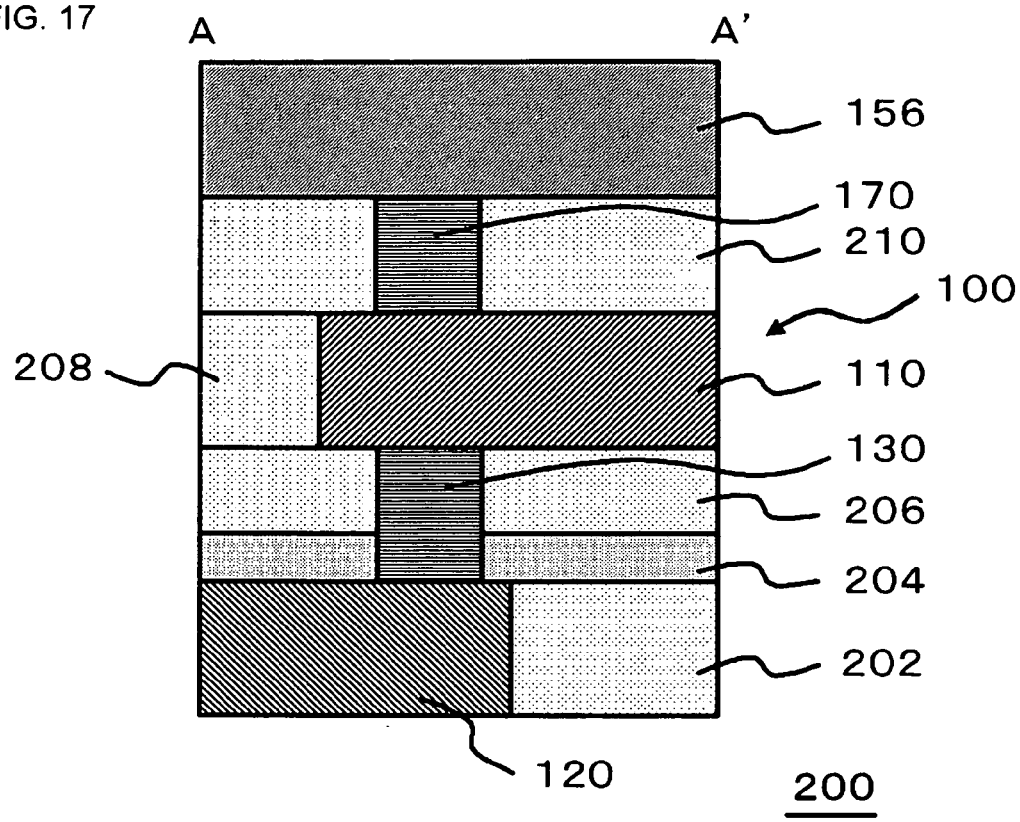
FIG. 17 is a cross-sectional view of the semiconductor device, taken along the line A-A' of FIG. 16.
Figure 18:
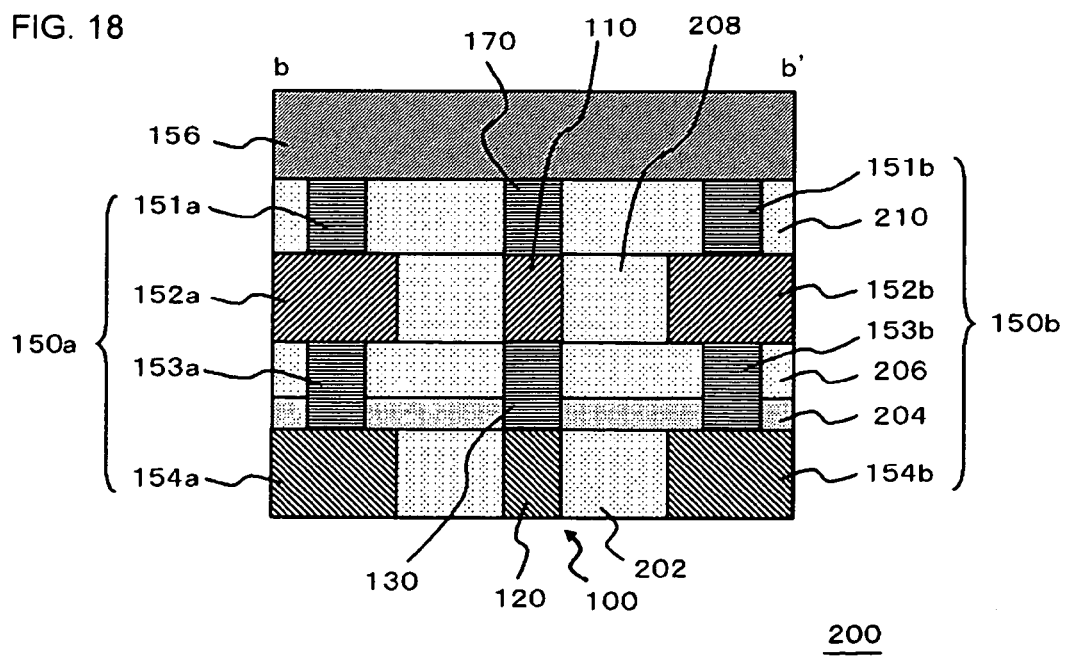
FIG. 18 is a cross-sectional view of the semiconductor device, taken along the line b-b' of FIG. 16.

FIG. 16 is a schematic plan view showing an example structure of a semiconductor device 200 in accordance with this embodiment. FIG. 17 is a cross-sectional view of the semiconductor device 200, taken along the line A-A' of FIG. 16. FIG. 18 is a cross-sectional view of the semiconductor device 200, taken along the line b-b' of FIG. 16. For ease of explanation, FIG. 16 shows the upper-layer wiring 110, the via 130, and the lower-layer wiring 120.

In this embodiment, the semiconductor device 200 further includes a via 170 (a third via) that connects the upper-layer wiring 110 and the upper plate electrode 156. The semiconductor device 200 does not have the connection wiring 158a and the connection wiring 158b described in the first embodiment. In this embodiment, the upper-layer wiring 110 is connected to the heat diffusion upper-layer wiring 152a through the via 170, the upper plate electrode 156, and the heat diffusion upper-layer via 151a (a fourth via). The upper-layer wiring 110 is also connected to the heat diffusion upper-layer wiring 152b through the via 170, the upper plate electrode 156, and the heat diffusion upper-layer via 151b (a fourth via).

Although the upper plate electrode 156 is formed above the upper-layer wiring 110 in the drawings, the semiconductor device 200 may further include a lower plate electrode placed under the lower-layer wiring 120, a via (a fifth via) connecting the lower-layer wiring 120 and the lower plate electrode, and a via (a sixth via) connecting the lower plate electrode and the heat diffusion lower-layer wiring 154a or the heat diffusion lower-layer wiring 154b.

Although embodiments of the present invention have been described with reference to the accompanying drawings, those embodiments are merely examples of the present invention, and other various structures may be employed.

Figure 13:
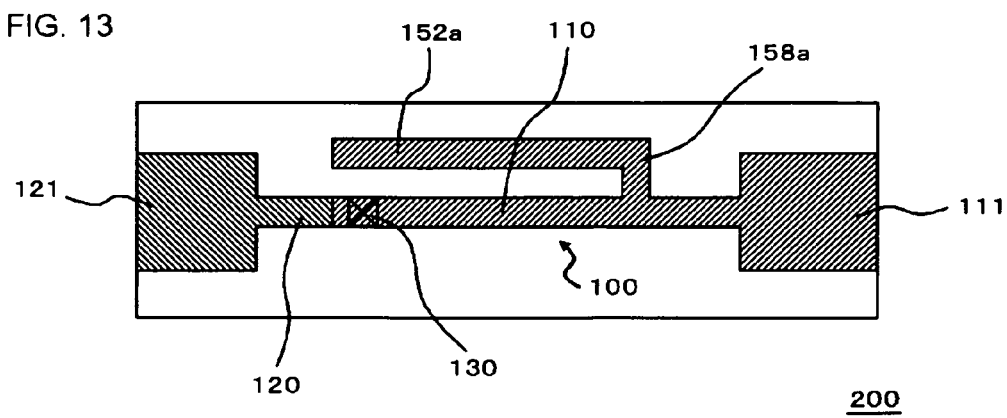
FIG. 13 is a schematic plan view showing an example structure of a semiconductor device including an electric fuse in accordance with yet another embodiment of the present invention.

FIG. 13 is a schematic plan view showing another example structure of the semiconductor device 200 of FIG. 8.

This example structure differs from the structure shown in FIG. 8, in that the heat diffusion upper-layer wiring 152a is provided only on one side of the upper-layer wiring 110, instead of on both sides of the upper-layer wiring 110. Even in the case where the heat diffusion upper-layer wiring 152a is provided only on one side of the upper-layer wiring 110, the upper-layer wiring 110 is electrically connected to the heat diffusion upper-layer wiring 152a, and accordingly, the heat generated in the electric fuse 100 can be released to the heat diffusion upper-layer wiring 152a.

It is possible to combine various example structures of the heat diffusion wirings of heat diffusion portions. For example, in the semiconductor device 200 having the structure of the first embodiment or the second embodiment, the heat diffusion upper-layer wiring 152a may be provided only on one side of the upper-layer wiring 110, instead of on both sides of the upper-layer wiring 110.

The heat diffusion wirings may be provided on both sides of the upper-layer wiring 110 or may be provided only on one side of the upper-layer wiring 110. Further, the heat diffusion wirings may be provided on both sides or on one side of each of the upper-layer wiring 110 and the lower-layer wiring 120. The heat diffusion portions may be formed in a continuous manner from the same layer as the lower-layer wiring 120, the same layer as the via 130, and to the same layer as the upper-layer wiring 110. In such an example, the heat diffusion portions may be electrically connected to either the upper-layer wiring 110 or the lower-layer wiring 120. In another example, the heat diffusion portions may be formed in the same layer as the low-layer wiring 120 and the same layer as the upper-layer wiring 110, and electrically connected to the upper-layer wiring 110 and the lower-layer wiring 120, respectively.

It is apparent that the present invention is not limited to the above embodiment, and may be modified and changed without departing from the scope and spirit of the invention.

What is claimed is:

1. A semiconductor device, comprising:
a substrate;
an electric fuse comprising a lower-layer wiring formed over said substrate, a first via provided on said lower-layer wiring and connected to said lower-layer wiring, and an upper-layer wiring provided on said first via and connected to said first via, a flowing-out portion, said flowing-out portion comprising a conductive material comprising said electric fuse being formed in a cut-off state of said electric fuse; and
a heat diffusion portion comprising a heat diffusion wiring that is formed in a same layer as one of said upper-layer wiring and said lower-layer wiring and is placed on a side of said one of said upper-layer wiring and said lower-layer wiring, said heat diffusion portion being electrically connected to said one of said upper-layer wiring and said lower-layer wiring,
wherein said heat diffusion wiring is formed at least on a side of a point where said one of said upper-layer wiring and said lower-layer wiring is connected to said first via.

2. The semiconductor device as claimed in claim 1, wherein said heat diffusion wiring is placed along with said one of said upper-layer wiring and said lower-layer wiring.

3. The semiconductor device as claimed in claim 1, wherein said heat diffusion portion further includes a connection wiring that is formed in the same layer as said one of said upper-layer wiring and said lower-layer wiring, and connects said heat diffusion wiring to said one of said upper-layer wiring and said lower-layer wiring.

4. The semiconductor device as claimed in claim 3, wherein said connection wiring is connected to said one of said upper-layer wiring and said lower-layer wiring at a point where said one of said upper-layer wiring and said lower-layer wiring is connected to said first via.

5. The semiconductor device as claimed in claim 3, wherein a width of said connection wiring is greater than a width of said one of said upper-layer wiring and said lower-layer wiring.

6. The semiconductor device as claimed in claim 1, wherein said heat diffusion wiring is formed on both sides of said one of said upper-layer wiring and said lower-layer wiring.

7. The semiconductor device as claimed in claim 1, wherein said heat diffusion wiring is formed on a side of each of said upper-layer wiring and said lower-layer.

8. The semiconductor device as claimed in claim 1, wherein said heat diffusion portion further includes another heat diffusion wiring and a second via, said another heat diffusion wiring overlapping with said heat diffusion wiring, in a plan view, and being formed in the same layer as the other one of said upper-layer wiring and said lower-layer wiring, said second via electrically connecting said another heat diffusion wiring and said heat diffusion wiring.

9. The semiconductor device as claimed in claim 1, wherein said heat diffusion wiring is formed in the same layer as said upper-layer wiring and is placed on a side of said upper-layer wiring, and
wherein said semiconductor device further comprises:
a plate electrode that is placed above said upper-layer wiring;
a third via that connects said upper-layer wiring and said plate electrode; and
a fourth via that connects said plate electrode and said heat diffusion wiring.

10. The semiconductor device as claimed in claim 1, wherein said heat diffusion wiring is formed in a same layer as said lower-layer wiring and is placed on a side of said lower-layer wiring, and
wherein said semiconductor device further comprises:
a plate electrode that is placed below said lower-layer wiring;
a fifth via that connects said lower-layer wiring and said plate electrode; and
a sixth via that connects said plate electrode and said heat diffusion wiring.

11. The semiconductor device as claimed in claim 1, wherein said electric fuse comprises a cut-off portion formed between said lower-layer wiring and one of said first via and in said first via.

12. The semiconductor device as claimed in claim 1, wherein a cut-off point is formed in said first via in the cut-off state.

13. A semiconductor device, comprising:
a substrate;
an electric fuse comprising:
a lower-layer wiring formed over said substrate;
a first via provided on said lower-layer wiring and connected to said lower-layer wiring; and
an upper-layer wiring provided on said first via and connected to said first via, the upper-layer wiring comprising a conductive material and being configured to flow out at a part of the electric fuse and to flow to a vicinity of the upper-wiring layer; and
a heat diffusion portion comprising an upper-layer heat diffusion wiring formed in a same layer as the upper-layer wiring, and formed on a side of said upper-layer wiring, said upper heat diffusion portion being electrically connected to said upper-layer wiring,
wherein said heat diffusion portion is formed at least on a side of a point where said one of said upper-layer wiring and said lower-layer wiring is connected to said first via.

14. The semiconductor device according to claim 13, further comprising a lower-layer heat diffusion wiring formed in a same layer as said lower-layer wiring, and formed on a side of said lower-layer wiring, said lower-layer heat diffusion portion being electrically connected to said lower-layer wiring, and to be overlapped by said upper-layer heat diffusion wiring.

15. The semiconductor device according to claim 14, wherein said lower-layer heat diffusion portion comprises:
a lower-layer connection wiring; and
a heat-diffusion lower-layering wiring formed on said side of said lower-layer wiring.

16. The semiconductor device according to claim 15, wherein said lower-layer heat diffusion portion further comprises a heat diffusion lower-layer via formed on the heat diffusion lower-layer wiring.

17. The semiconductor device according to claim 13, wherein said upper-layer heat diffusion portion comprises:
an upper-layer connection wiring; and
a heat-diffusion upper-layer wiring formed on said side of said upper-layer wiring, said upper-layer connection wiring connecting said heat diffusion upper layer-wiring to said upper-layer wiring.

18. The semiconductor device according to claim 17, wherein said upper-layer heat diffusion portion further comprises a heat diffusion upper-layer via formed on the heat diffusion upper-layer wiring.

19. A semiconductor device, comprising:
a. substrate;
a crack assist type electric fuse comprising a lower-layer wiring formed on said substrate, a first via provided on said lower-layer wiring and connected to said lower-layer wiring, and an upper-layer wiring provided on said first via and connected to said first via, the upper-layer wiring comprising a conductive, material and being configured to flow out upon a delivery of a predetermined voltage; and
a heat diffusion portion comprising as heat diffusion wiring that is formed in a same layer as one of said upper-layer wiring and said lower-layer wiring, and is placed on a side of a point where said one of said upper-layer wiring and said lower-layer wiring is connected to said first via, said heat diffusion portion being electrically connected to said one of said upper-layer wiring and said lower-layer wiring.

* * * * *